United States Patent
Buehler et al.

(10) Patent No.: US 6,716,771 B2
(45) Date of Patent: Apr. 6, 2004

(54) METHOD FOR POST-CMP CONVERSION OF A HYDROPHOBIC SURFACE OF A LOW-K DIELECTRIC LAYER TO A HYDROPHILIC SURFACE

(75) Inventors: Mark F. Buehler, Portland, OR (US); Larry R. Fredrickson, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/119,805

(22) Filed: Apr. 9, 2002

(65) Prior Publication Data

US 2003/0190816 A1 Oct. 9, 2003

(51) Int. Cl.$^7$ .................... H01L 21/31; H01L 21/469; H01L 21/4763
(52) U.S. Cl. .................... 438/783; 438/624; 438/626; 438/633; 438/786
(58) Field of Search .................... 438/783, 786–790, 438/624, 626, 631, 633, 687, 691

(56) References Cited

U.S. PATENT DOCUMENTS

| | | | |
|---|---|---|---|
| 6,166,439 A | * | 12/2000 | Cox .................... 257/758 |
| 6,429,117 B1 | * | 8/2002 | Sudijono et al. .................... 438/627 |
| 6,436,302 B1 | * | 8/2002 | Li et al. .................... 216/38 |
| 6,455,443 B1 | * | 9/2002 | Eckert et al. .................... 438/781 |
| 6,562,222 B1 | * | 5/2003 | Sekiguchi et al. .................... 205/296 |
| 6,582,623 B1 | * | 6/2003 | Grumbine et al. .................... 252/79.1 |
| 2002/0076932 A1 | * | 6/2002 | Dirksen et al. .................... 438/690 |
| 2002/0079487 A1 | * | 6/2002 | Ramanath et al. .................... 257/40 |
| 2002/0125461 A1 | * | 9/2002 | Chou et al. .................... 252/79.1 |

FOREIGN PATENT DOCUMENTS

| | | | | |
|---|---|---|---|---|
| EP | 1093161 A1 | * | 4/2001 | .......... H01L/21/768 |
| JP | 2001244383 A | * | 9/2001 | .......... H01L/23/28 |

OTHER PUBLICATIONS

Wolf, et al. Silicon Processing for the VLSI Era, vol. 1–Process Technology, 2nd ed., Lattice Press: Sunset Beach CA, 2000, pp. 761–764, 797–801.*

* cited by examiner

Primary Examiner—Erik Kielin
(74) Attorney, Agent, or Firm—Mark V. Seeley

(57) ABSTRACT

A method of converting a hydrophobic surface of a dielectric layer to a hydrophilic surface is described. That method comprises forming on a substrate a dielectric layer that has a hydrophobic surface, then coupling a hydrophilic component to the surface of the dielectric layer. Also described is a method for making a semiconductor device that employs this technique after polishing a conductive layer, which may comprise copper.

1 Claim, 3 Drawing Sheets

METHOD FOR POST-CMP CONVERSION OF A HYDROPHOBIC SURFACE OF A LOW-K DIELECTRIC LAYER TO A HYDROPHILIC SURFACE

FIELD OF THE INVENTION

The present invention relates to a method of making semiconductor devices, in particular, those that include low-k or ultra low-k dielectric layers, which have hydrophobic surfaces when initially deposited.

BACKGROUND OF THE INVENTION

Semiconductor devices include metal layers that are insulated from each other by dielectric layers. As device features shrink, reducing the distance between the metal layers and between metal lines formed within each layer, capacitance increases. To address this problem, insulating materials that have a relatively low dielectric constant are being used in place of silicon dioxide to form the dielectric layer that separates the metal lines.

Conventional single or dual damascene processes may be used to form metal lines within such low-k dielectric layers, e.g., to generate the structure 100 shown in FIG. 1b. FIG. 1a represents a cross-section of that structure prior to a polishing operation. In that figure, structure 100 includes substrate 101, upon which is formed low-k dielectric layer 102. After a trench has been etched into low-k dielectric layer 102, barrier layer 103 is deposited. In addition to lining the trench, barrier layer 103 extends across surface 104 of low-k dielectric layer 102. Conductive layer 105, which may comprise copper, fills the trench and covers barrier layer 103, where that layer rests on top of surface 104.

After forming the FIG. 1a structure, the excess material deposited on surface 104 must be removed, e.g., by using a conventional chemical mechanical polishing ("CMP") process. Such a CMP operation may generate a structure in which barrier layer 103 and copper layer 105 remain within the trench only—as shown in FIG. 1b. Many commercially available rotary and orbital polishers may be used to perform such a CMP step. One example is the Reflexion™ 300 mm CMP system, which is available from Applied Materials, Inc.

After the CMP operation, structure 100 may be covered with thousands of slurry particles that must be removed, along with various metal contaminants. To remove those materials, structure 100 may be subjected to a series of cleaning and scrubbing steps. Many commercially available tools, e.g., the Reflexion system mentioned above, integrate CMP modules with a number of cleaning modules that perform those cleaning and scrubbing functions.

Certain materials that may be used to form low-k dielectric layers (e.g., carbon doped oxides) are hydrophobic. When processing a semiconductor wafer, which is covered by such a hydrophobic layer, through a tool's post-CMP cleaning modules, water drains off the wafer as it is moved from one module to the next. Any remaining water droplets may migrate to the interface between the conductive layer and the low-k dielectric layer. As those droplets shrink, the concentration of corrosive chemicals present in them may rise significantly. When the conductive layer includes copper, such highly concentrated droplets may corrode the copper. In addition, such rapid water loss may leave a significant amount of organic residue, which may render it difficult to bond the low-k dielectric layer to subsequently deposited materials.

Accordingly, there is a need for an improved process for making a semiconductor device that includes a hydrophobic dielectric layer. There is a need for such a process that converts a hydrophobic surface of such a layer to a hydrophilic one in a relatively simple way. There is a need for such a process that may be used during a post-CMP cleaning operation to reduce corrosion and improve adhesion characteristics. The method of the present invention provides such a process.

DETAILED DESCRIPTION OF THE PRESENT INVENTION

Figure 1A:
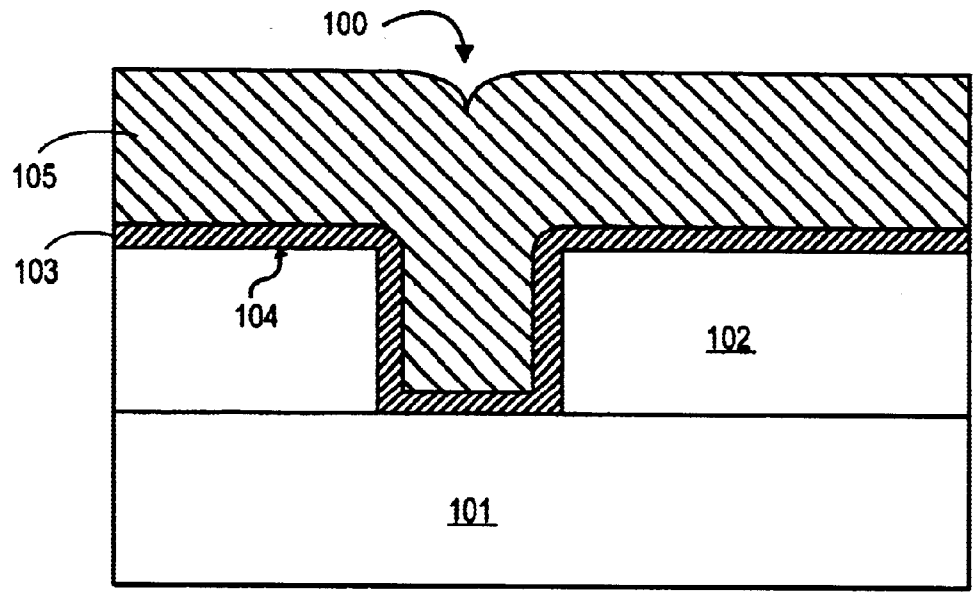
FIGS. 1a–1b represent cross-sections of structures that may result after certain steps are used when making a semiconductor device.

A method is described for converting a hydrophobic surface of a dielectric layer to a hydrophilic surface. That method comprises forming on a substrate a dielectric layer that has a hydrophobic surface. A hydrophilic component is then coupled to the surface of that dielectric layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In one embodiment of the method of the present invention, a hydrophilic component is coupled to a dielectric layer's hydrophobic surface by exposing the dielectric layer to a solution that comprises the hydrophilic component. Such a hydrophilic component may comprise a first moiety that is hydrophilic and a second moiety that may bind the hydrophilic component to the surface of the dielectric layer. When a hydroxyl group is located on the dielectric layer's surface, the second moiety may comprise a hydroxyl or alkoxy group. Such a moiety may react with the hydroxyl group located on the dielectric layer's surface to form a chemical bond between that surface and the hydrophilic component.

Such a hydrophilic component may have the molecular formula $(OX)_y MA_b Z$, in which X is hydrogen or an alkyl group, y is between 1 and 3, M is a metal element, A comprises a constituent bonded to the metal element, b is between 0 and 2, and Z is a hydrophilic moiety. The hydrophilic moiety may comprise a polar moiety such as a carboxylic acid, aldehydic, phosphoric, sulfuric, or amino group. Particularly preferred are those that comprise a carboxylic acid or an amino group. Although a few examples of components—from which the hydrophilic moiety may be made—are given here, those skilled in the art will appreciate that others may be used instead. Similarly, the hydrophilic moiety may consist solely of one of these listed components, or, alternatively, may comprise a combination of those components, and/or others. The metal may comprise silicon, aluminum, or any other metal that may bind to the component's hydrophilic group and its hydroxyl or alkoxy group or groups.

The hydrophilic component and the dielectric surface should be allowed to react for a sufficient time to convert the dielectric layer's hydrophobic surface to a hydrophilic surface. In a preferred embodiment, such a conversion may take place in less than 80 seconds, and more preferably in less than 45 seconds. The rate at which the hydrophilic component reacts with the dielectric layer's surface may depend upon the concentration of the hydrophilic component, and the solution's temperature. In one embodiment, the solution includes an appropriate solvent—e.g., deionized water, acetone, propionic acid, an alcohol (e.g., methanol, ethanol, propanol, butanol, etc.), or any other liquid able to disperse the hydrophilic component, and the hydrophilic component makes up between about 0.01% and about 50% (preferably between about 0.1% and about 5%) of the solution by weight. In such an embodiment, the solvent preferably comprises at least about 50% of the solution by weight. The reaction preferably takes place while the solution's temperature is kept at between about 20° C. and about 70° C.—and more preferably between about 35° C. and about 70° C.

The hydrophilic component containing solution may also include a corrosion inhibitor, such as benzotriazole, cetyltrimethylammonium hydroxide or a cetyltrimethylammonium halide (e.g., cetyltrimethylammonium bromide or cetyltrimethylammonium chloride). Such a corrosion inhibitor preferably is included in the solution at a concentration of between about 0.001M and about 0.05M. The solution's pH preferably is between about 2 and about 12, and may be adjusted by adding an appropriate base or acid. When the solution is applied to a surface that includes exposed copper, its pH is preferably adjusted to between about 10 and about 12.

Figure 2A:
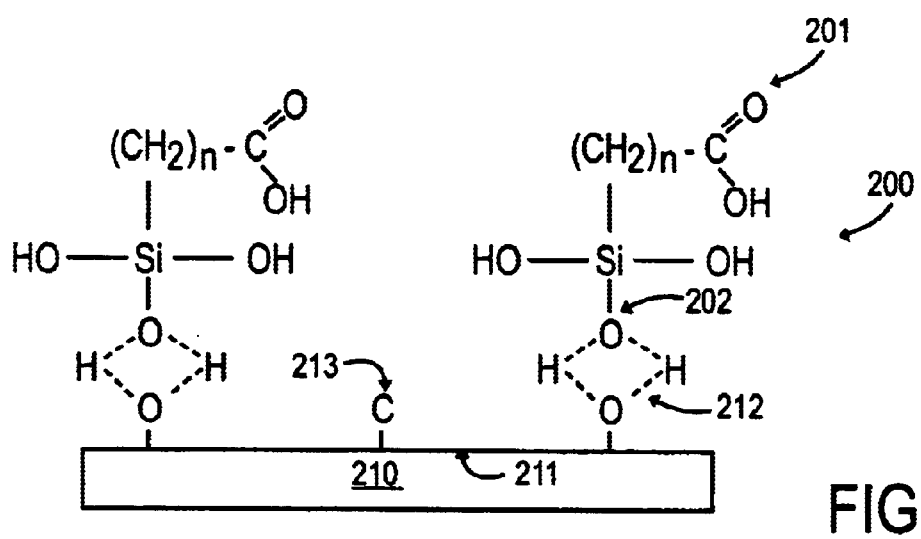
FIGS. 2a–2b illustrate a mechanism believed to cause a hydrophilic component to attach to a hydrophobic surface of a dielectric layer.
Figure 2B:
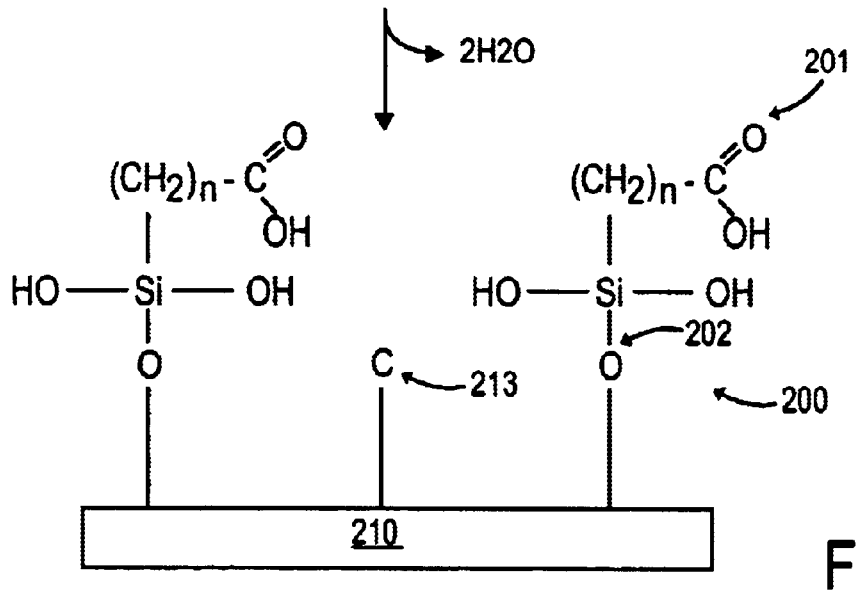

FIGS. 2a and 2b illustrate a mechanism believed responsible for causing a hydrophilic component, which has at least one hydroxyl group, to attach to a hydrophobic surface of a dielectric layer—in this case one that contains a carbon doped oxide. In the illustrated embodiment, hydrophilic component 200 is a silicon based compound (which may be referred to as a silane coupling agent) that includes first moiety 201 and second moiety 202. First moiety 201 is hydrophilic and second moiety 202 is a hydroxyl group. Carbon doped oxide containing dielectric layer 210 includes hydrophobic surface 211. Surface 211 is believed to be hydrophobic because of the presence of carbon atoms 213 that are located at that surface. Hydroxyl group 212—also located on surface 211—may become attached to that surface during a preceding polishing operation.

As shown in FIG. 2a, it is believed that hydrogen bonds initially join silane coupling agent 200 to surface 211 of carbon doped oxide 210. A subsequent hydrolysis reaction between hydroxyl group 202 of coupling agent 200 and hydroxyl group 212 of layer 210 may then take place. Such a reaction may release water while coupling agent 200 is chemically bonded to dielectric layer 210—generating the FIG. 2b structure. Note that hydrophilic moiety 201 shields hydrophobic carbon atoms 213, which serves to convert the hydrophobic surface of dielectric layer 210 to a hydrophilic surface.

Although FIGS. 2a and 2b illustrate a silane coupling agent in which the hydrophilic moiety is a single carboxylic acid group, other hydrophilic components (including those listed above) may be used instead. Particularly preferred are compounds in which the hydrophilic moiety comprises a number of tri-acetic acid groups and/or other polar components. One example is N-[(3-Trimethoxysilyl)propyl] ethylenediamine triacetic acid. After reacting with water, that compound will have the following structural formula:

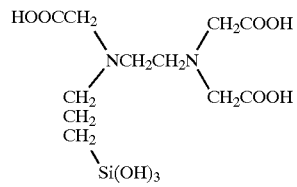

Another example is trimethoxysilylpropyldiethylenetriamine. After reacting with water, that compound will have the following structural formula:

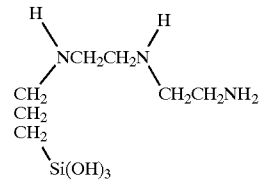

The method of the present invention may be used in many contexts. For example, it may be used when making a semiconductor device that includes a carbon doped oxide containing dielectric layer, e.g., being applied to convert a hydrophobic surface of such a dielectric layer into a hydrophilic surface. Such a carbon doped oxide may comprise silicon or another metal, e.g., aluminum. When such a dielectric layer receives a conductive layer, e.g., as a result of single or dual damascene processing, the method of the present invention may be applied during the post-CMP cleaning operation.

Figure 1B:
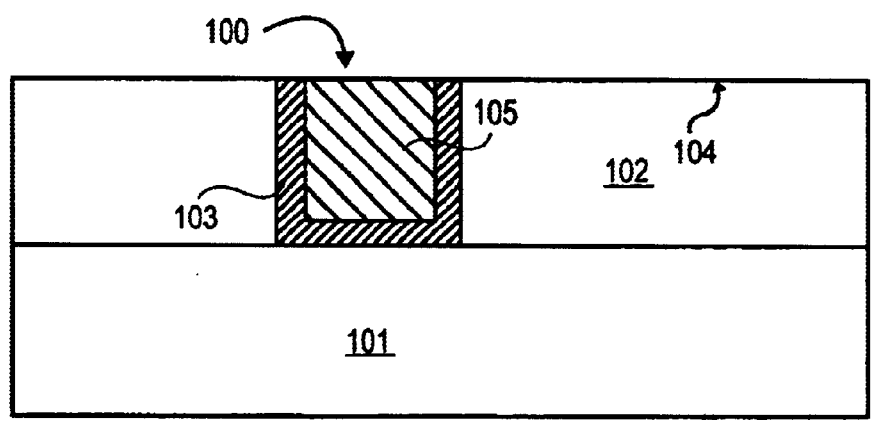
Figure 3A:
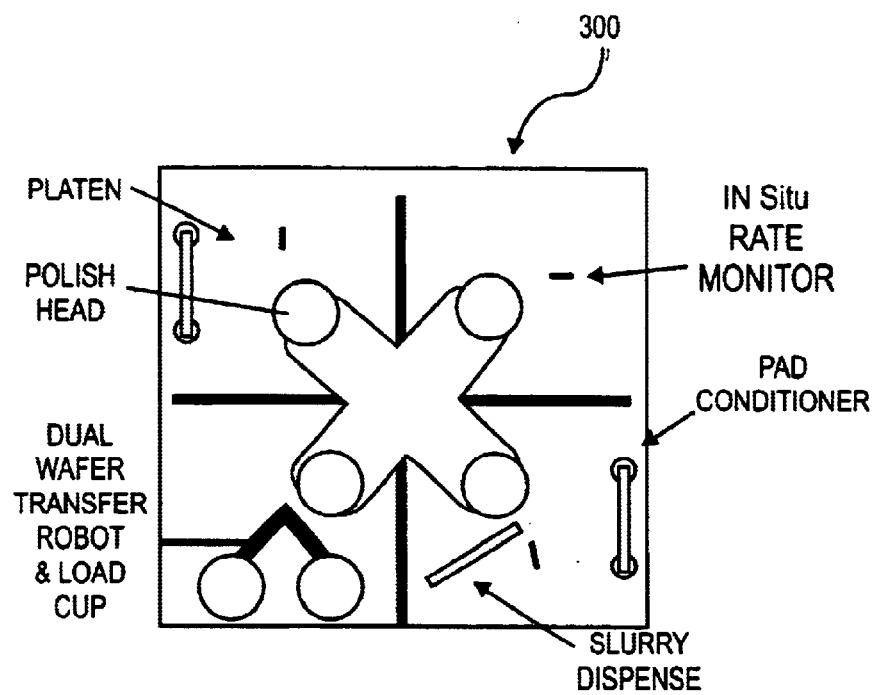
FIGS. 3a–3b schematically represent apparatus that may be used, when carrying out an embodiment of the method of the present invention.
Figure 3B:
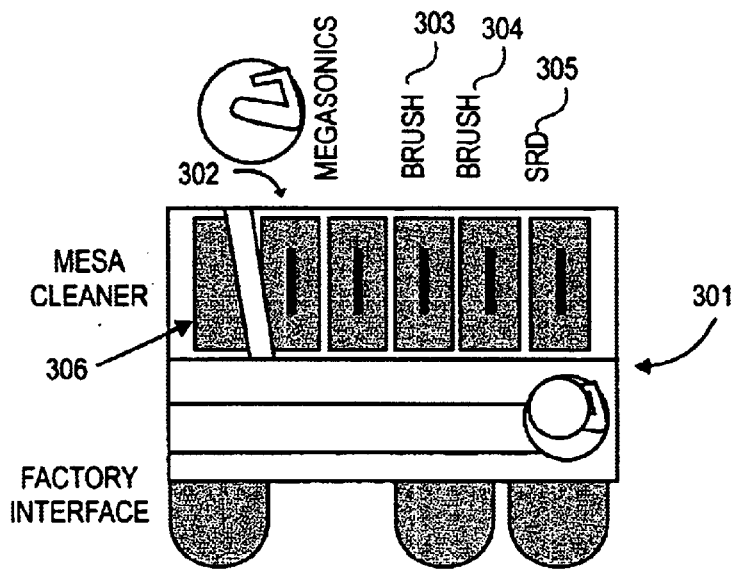

Take, for example, a silicon wafer that includes the post-CMP structure shown in FIG. 1b. Such a silicon wafer may be subjected to a series of cleaning and scrubbing steps. An integrated polishing and cleaning tool may be used to perform such a cleaning sequence. FIGS. 3a–3b schematically represent such an integrated tool, i.e., the Reflexion system mentioned above. That system includes CMP unit 300 and cleaning unit 301—shown schematically in FIGS. 3a and 3b, respectively. CMP unit 300 includes a number of CMP modules—identified in FIG. 3a, and cleaning unit 301 includes a number of cleaning modules—identified in FIG. 3b.

After a wafer is polished, it is transferred to cleaning unit 301. There, it is initially placed in input station 306, then moved to megasonics cleaning station 302, then transferred to scrubbing modules 303 and 304, and then moved to spin-rinse-dry module 305. While in megasonics cleaning station 302, the wafer is subjected to a megasonics cleaning operation, which removes surface particles from the wafer and into a cleaning solution. In the scrubbing stages, brushes scrub the wafer's front and back sides and its edges, using appropriate chemicals, to remove remaining particles. The spin-rinse-dry stage then removes from the wafer the cleaning chemicals and any particles still suspended in solution.

As already indicated above, when dielectric layer 102 comprises a carbon doped oxide, or another hydrophobic material, and conductive layer 105 comprises copper, the hydrophobic character of layer 102's surface may contribute to corrosion in copper layer 105, which may occur during the post CMP cleaning operation. The method of the present invention reduces the amount of corrosion that may occur by converting the hydrophobic surface of dielectric layer 102 to a hydrophilic surface. This may be accomplished by attaching a hydrophilic component to the surface of dielectric layer 102 as the wafer, upon which that layer is formed, is processed through cleaning unit 301.

A hydrophilic component may be attached to dielectric layer 102 by exposing that layer to a solution that includes that component (e.g., a solution like those described above), when the wafer is located in one of the cleaning modules included in cleaning unit 301. For example, such a hydrophilic component containing solution may be applied to the wafer when the wafer is located in megasonics cleaning station 302. Alternatively, such a solution may be applied to the wafer after the wafer is moved to scrubbing modules 303 and 304. The solution may be fed into the scrubbing modules or alternatively coated or integrated into the brushes used to perform the cleaning operation.

Regardless of the particular way in which a hydrophilic component containing solution is applied to a wafer as it is processed through such a tool, contact between that solution and a dielectric layer's hydrophobic surface should be maintained long enough to ensure conversion of that surface to a hydrophilic surface. At the same time, it may be advantageous to minimize the contact duration to ensure acceptable throughput. When the reaction takes place at a relatively high temperature, e.g., between about 60° C. and about 70° C., an appropriate level of conversion may take place in as little as 30 seconds. If the reaction takes place at a lower temperature, then it may be desirable to maintain contact between the solution and the surface of the dielectric layer for between about 45 seconds and about 80 seconds. The appropriate time and temperature may vary depending upon the nature of the hydrophilic component and its concentration.

The process of the present invention provides a convenient and inexpensive way to convert a hydrophobic surface of a dielectric layer into a hydrophilic surface, which can reduce corrosion and may improve adhesion. Another potential advantage of the described method is that it enables the hydrophobic surface to be restored relatively easily, e.g., by simply removing the attached hydrophilic component. Because only the dielectric layer surface is modified, leaving unchanged the underlying bulk of that layer, removing that component will convert the hydrophilic surface back to a hydrophobic surface, e.g., if desired prior to subsequently depositing certain materials onto the dielectric layer.

Although the foregoing description has demonstrated how certain processes for making semiconductor devices can benefit from the use of this method, the method of the present invention may be used in many other contexts. The method of the present invention may be applied to convert a hydrophobic surface of a dielectric layer to a hydrophilic surface, regardless of how the underlying substrate is constituted, regardless of the type of hydrophobic material that is used to make the dielectric layer, and regardless of the application to which the resulting structure is employed.

Although the foregoing description has specified certain steps, materials, and equipment that may be used in the above described method for converting a hydrophobic surface of a dielectric layer to a hydrophilic surface, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a semiconductor device comprising:

forming on a substrate a silicon based carbon doped oxide dielectric layer;

removing excess material from the silicon based carbon doped oxide dielectric layer using a chemical mechanical polishing process;

transferring the substrate with the silicon based carbon doped oxide dielectric layer to a cleaning unit;

exposing the surface of the silicon based carbon doped oxide dielectric layer, while in the cleaning unit, to a solution for less than about 80 seconds at a temperature of between about 20° C. and about 70° C., the solution comprising a hydrophilic component and a corrosion inhibitor, the hydrophilic component comprising between about 0.01% and about 50% of the solution by weight and the corrosion inhibitor being included in the solution at a concentration of between about 0.001M and about 0.05M; and then coupling the hydrophilic component to the surface of the silicon based carbon doped oxide dielectric layer, wherein the hydrophilic component is selected from the group consisting of N-[(3-Trimethoxysilyl)propyl] ethylenediamine triacetic acid and trimethoxysilylpropyldiethylenetriamine, and wherein the corrosion inhibitor is selected from the group consisting of benzotriazole, cetyltrimethylammonium hydroxide, and a cetyltrimethylammonium halide.

* * * * *